United States Patent [19]

Tanaka

[11] Patent Number: 4,490,585
[45] Date of Patent: Dec. 25, 1984

[54] HEARING AID

[75] Inventor: Katsumi Tanaka, Akishima, Japan

[73] Assignee: Rion Kabushiki Kaisha, Japan

[21] Appl. No.: 434,076

[22] Filed: Oct. 8, 1982

[30] Foreign Application Priority Data

Oct. 13, 1981 [JP] Japan ............................ 56-151836[U]

[51] Int. Cl.³ ............................................ H04R 25/00
[52] U.S. Cl. ................................. 179/107 FD; 381/68
[58] Field of Search ................... 179/107 FD, 107 R; 381/68

[56] References Cited

U.S. PATENT DOCUMENTS

| | | | |
|---|---|---|---|
| 3,209,083 | 9/1965 | Posen | 179/107 FD |
| 3,764,745 | 10/1978 | Bottcher | 179/107 FD |
| 3,920,931 | 11/1975 | Yanick | 179/107 FD |
| 4,025,721 | 5/1977 | Graupe | 179/107 FD |
| 4,119,814 | 10/1978 | Harless | 179/107 FD |
| 4,405,831 | 9/1983 | Michelson | 179/107 FD |

FOREIGN PATENT DOCUMENTS 2353696 10/1973 Fed. Rep. of Germany ...... 179/107 FD

Primary Examiner—Gene Z. Rubinson
Assistant Examiner—L. C. Schroeder
Attorney, Agent, or Firm—Beveridge, De Grandi & Kline

[57] ABSTRACT

A hearing aid is made up of an automatic filter circuit for transmitting an input signal in a predetermined characteristic, and a low frequency component detecting circuit for detecting the low frequency component of the input signal, to change the characteristic of the automatic filter circuit according to the detection level, the cut-off frequency of the automatic filter circuit being changed according to the output control signal of the low frequency component detecting circuit.

9 Claims, 5 Drawing Figures

HEARING AID

BACKGROUND OF THE INVENTION

This invention relates to hearing aids, and more particularly to a hearing aid the output characteristic of which is automatically controlled according to the ambient noise.

In a conventional hearing aid which operates according to environmental conditions, the input signal is divided into two frequency components by a low-pass filter and a high-pass filter, and only the low frequency component is suppressed by a compression circuit. With the hearing aid, the quality of sound of voices in a noisy environment is scarcely affected. However, as the low frequency component of the noise is merely suppressed, i.e., the level is merely suppressed, when the level of a voice to be heard is increased with the level of the noise, apparently the S/N ratio of the voice is improved; however, when only the noise level is increased with the sound level maintained unchanged, and S/N ratio is not improved.

SUMMARY OF THE INVENTION

In view of the foregoing, an object of this invention is to provide a hearing aid which comprises an automatic noise suppressor the cut-off frequency of which is changed according to the ambient noise, and a filter having a steep gradient characteristic for positively eliminating unwanted low frequency components, and in which the cutoff frequency of the automatic noise suppressor is so controlled that it may not become unnecessarily high, thereby minimizing the effect on the quality of sound reproduced, and the S/N ratio of voice is efficiently improved.

The foregoing object and other objects of the invention have been achieved by the provision of a hearing aid comprising an automatic filter circuit for transmitting an input signal in a predetermined characteristic, to suppress a noise signal in the input signal, and a low frequency component detecting circuit for detecting a low frequency component of the input signal, to provide a control signal for changing the characteristic of the automatic filter circuit according to the level of the low frequency component thus detected. According to the invention, the automatic filter circuit operates to change the cut-off frequency of the characteristic according to the control signal of the low frequency component detecting circuit.

Through experiments performed by the inventor, it has been confirmed that the cut-off frequency of the automatic noise suppressor and the gradient of the characteristic curve of the filter are important factors for effectively removing the low frequency component, and it is suitable that the cut-off frequency is generally about 1.5 KHz, and that, with the gradient set to about 18 dB/oct, voices can be clearly heard in a noisy circumference.

The nature, principle and utility of the invention will become more apparent from the following detailed description and the appended claims when read in conjunction with the accompanying drawings.

DETAILED DESCRIPTION OF THE INVENTION

Figure 1:
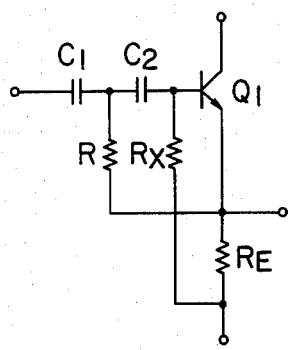
FIGS. 1 through 4 are circuit diagrams for a description of the technical process of this invention.

The fundamental circuit of an automatic noise suppressor is an shown in FIG. 1. When, in a general NF type CR filter with an impedance changing transistor $Q_1$, the cut-off frequency is represented by $\omega_O$, the filter characteristic constant is represented by $\xi$ and $C_1 = C_2 = C$, then $$R_x = \frac{1}{\omega_O C \xi} \text{ and } R = \frac{\xi}{\omega_O C}$$

Therefore, $$\omega_O = \frac{1}{C \sqrt{R_x \cdot R}}$$

Accordingly, the value $\omega_O$ is changed by changing the value $R_x$.

Figure 2:
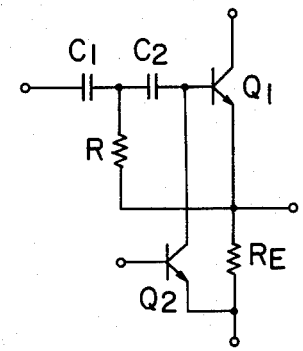

The value $R_x$ is replaced by a transistor $Q_2$ as shown in FIG. 2, and a control voltage is applied to the base of the transistor $Q_2$. When the voltage becomes higher by about 0.6 V than the emitter voltage of the transistor $Q_2$, the impedance between the collector and emitter of the transistor $Q_2$ is changed according to the voltage. Accordingly, as is apparent from the above-described equation, the cut-off frequency of the filter is changed. Therefore, a voltage-controlled filter can be realized in which the cut-off frequency is increased with the control voltage.

In this connection, the circuit may be so designed that the control voltage will not exceed a certain value. In this case, an upper limit is given to the cut-off frequency, in conformance with the object of this invention.

Figure 3:
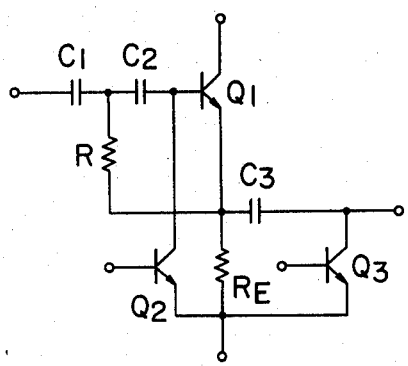
Figure 4:
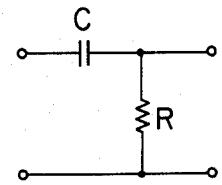

The characteristic curve of such a filter may be made steep by a method in which, as shown in FIG. 3, a capacitor $C_3$ and a transistor $Q_3$ are added, and similarly a control voltage is applied to the base of the transistor $Q_3$. The combination of the capacitor $C_3$ and the transistor $Q_3$ is equivalent to a CR high-pass filter of 6 dB/oct in FIG. 4 in which the resistance of a resistor R is variable. In this case, the cut-off frequency can be represented by $\omega_{01} = 1/CR$, and the value $\omega_{01}$ is changed as the value R changes. Accordingly, by changing the control voltage applied to the base of the transistor $Q_3$, the impedance between the collector and emitter of the transistor $Q_3$ is changed, and the cut-off frequency is changed.

Figure 5:
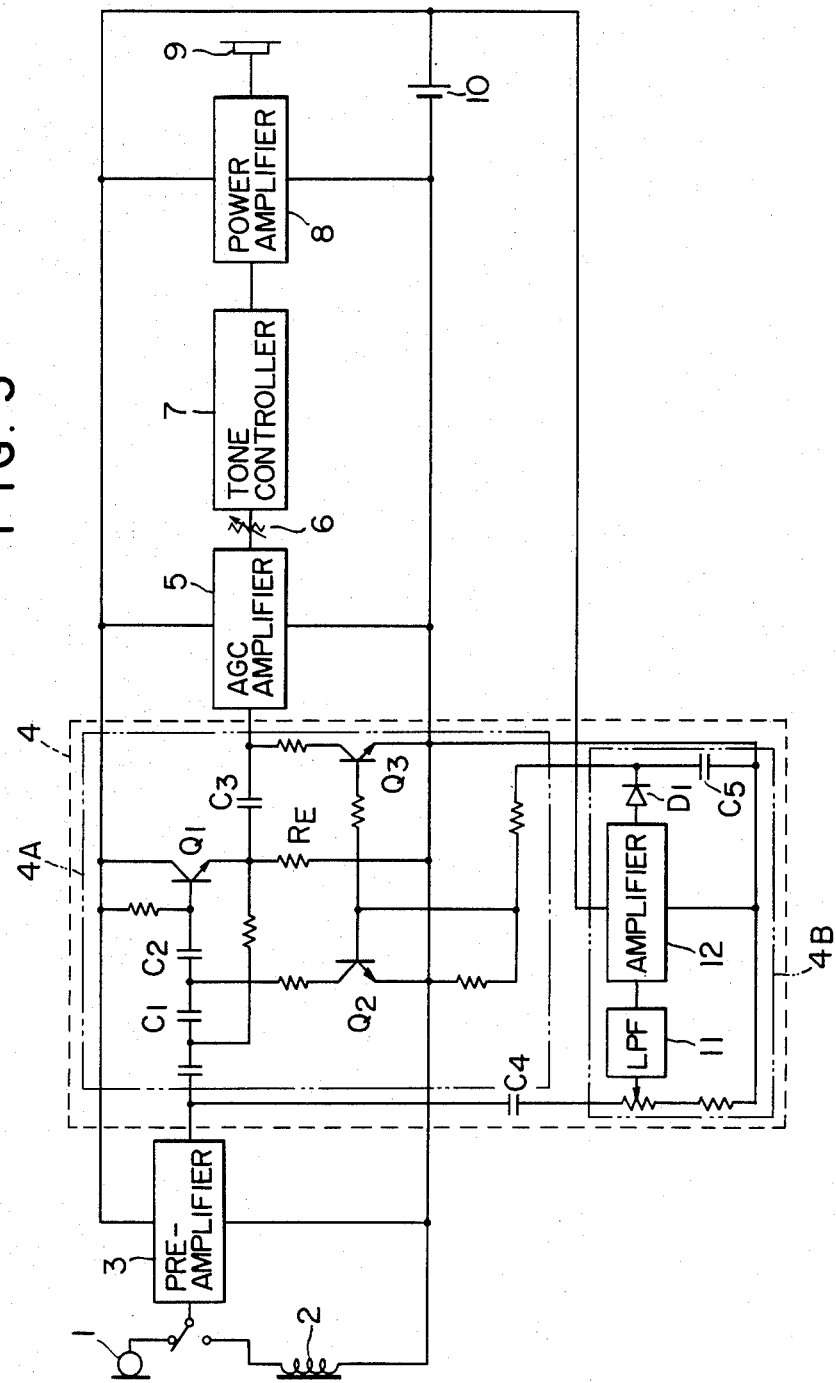
FIG. 5 is a circuit diagram showing one example of a hearing aid according to this invention.

One example of a hearing aid according to the invention, as shown in FIG. 5, includes the above-described circuits. More specifically, the hearing aid comprises: a preamplifier 3 for amplifying signals from a microphone 1 or a telephone pickup coil 2; an automatic noise suppressor 4; an AGC amplifier 5; a variable resistor 6; a tone controller 7; a power amplifier 8; an ear phone 9; and a battery 10. The automatic noise suppressor 4 comprises: an automatic filter circuit 4A as shown in FIG. 3; and a low frequency component detecting circuit 4B made up of a low-pass filter 11, an amplifier 12, a diode $D_1$ and a capacitor $C_5$.

The operation of the hearing aid thus organized will now be described.

An input signal is amplified by the preamplifier 3, and is applied to the automatic filter circuit 4A and also through a capacitor C4 to the low frequency component detecting circuit 4B. In the circuit 4B, out of the input signal a low frequency spectrum part is selected by the low-pass filter 11, amplified by the amplifier 12, and rectified and smoothed by the diode $D_1$ and the capacitor $C_5$. Transmission of the low frequency component depends on the characteristic of the low-pass filter 11. Therefore, the low frequency component of ambient noise included in the input signal can be extracted by suitably selecting the characteristic. Accordingly, a DC voltage according to the level of the low frequency component thus extracted, or a so-called "control voltage", can be obtained. The control voltage thus obtained is applied to the bases of the transistors $Q_2$ and $Q_3$.

When the control voltage becomes higher by about 0.6 V than the emitter potential of each of the transistors $Q_2$ and $Q_3$, the impedance between the collector and emitter of the transistor is reduced, and the cut-off frequency of the automatic filter circuit 4A is changed. Accordingly, the low frequency ambient noise component included in the input signal is eliminated according to the level and spectrum thereof. That is, as the level of an ambient noise, which has a spectrum passing through the low-pass filter 11, becomes higher than a certain value, the cut-off frequency of the automatic filter circuit 4A is automatically increased.

Since the output control signal of the low frequency component detecting circuit 4B will never become higher than the voltage (1.5 V) of the power source 10, the highest cut-off frequency can be set to 1.5 KHz. A limiter may be additionally provided to determine the highest cut-off frequency.

In the above-described circuit, bipolar transistors are employed; however, it goes without saying that other active elements may be employed instead of the transistors. Furthermore, the above-described hearing aid has the microphone 1 and the telephone pickup coil 2 to receive the input signal for the automatic filter circuit 4A and the low frequency component detecting circuit 4B; however, it goes without saying that the hearing aid may be merely provided with only one of the microphone and telephone pickup coil.

As is apparent from the above description, in the hearing aid according to the invention, the cut-off frequency is set high to eliminate the low frequency component, thereby to remove the low frequency ambient noise out of the voice to be heard. That is, with the hearing aid, the user can hear voices in a high S/N ratio.

In other words, with the hearing aid, which is simple in arrangement, voices can be clearly heard in a noisy environment which should be highly appreciated in practical use. Furthermore, as the filter circuit includes the impedance changing transistor, a high input impedance can be obtained and accordingly the hearing aid can be coupled suitably to a variety of microphones.

What is claimed is:

1. A hearing aid comprising:
   input means adapted for connection to a microphone, for providing an input signal corresponding with audio sound detected by the microphone;
   a low frequency detecting and rectifying circuit connected to said input means for providing a control signal proportional to the level of the low frequency noise in the input signal;
   a voltage controlled automatic filter circuit connected to said input means for receipt of the input signal therefrom and connected to said low frequency detecting and rectifying circuit for receipt of the control signal therefrom, and responsive to the control signal for passing the input signal as an output signal having low frequency cut-off determined by the value of the control signal to suppress from the output signal low frequency noise in the input signal; and
   amplification means connected to said filter circuit and adapted for connection to a speaker for applying the amplified output signal to the speaker for generation of sounds corresponding thereto.

2. A hearing aid as claimed in claim 1, in which said automatic filter circuit comprises: an impedance changing transistor; a cut-off frequency selecting transistor; and means applying the control signal to the base of said cut-off frequency selecting transistor.

3. A hearing aid as claimed in claim 1, in which said low frequency detecting circuit comprises: a low-pass filter for transmitting only the low frequency components of the input signal; and a rectifying and smoothing circuit for extracting a DC component out of the signal transmitted by said low-pass filter to form the control signal.

4. A hearing aid as claimed in claim 1, in which said automatic filter circuit comprises as the output stage thereof a transistor having the control signal applied to the base thereof for making the gradient characteristic curve of said filter steep.

5. A hearing aid as claimed in claim 1, in which the control signal from said low frequency detecting and rectifying circuit allows the cut-off frequency of said automatic filter circuit to be about 1.5 KHz maximum.

6. A hearing aid as claimed in claim 5, in which when the cut-off frequency of said automatic filter circuit is maximum, the output gradient characteristic is of 18 dB/oct.

7. A hearing aid as claimed in claim 1 further comprising a microphone connected to said input means for detection of audio sounds and application to said input means of voltage signals corresponding with the detected audio sounds.

8. A hearing aid as claimed in claim 1 further comprising:
   a microphone;
   a telephone pickup; and
   switching means connected to said microphone, said telephone pickup, and said input means and capable of alternatively assuming a first switch position in which audio sounds detected by said microphone are converted to voltage signals and applied to said input means and a second switch position in which telephone signals detected by said telephone pickup are converted to voltage signals and applied to said input means.

9. A hearing aid as claimed in claim 1 further comprising a telephone pickup connected to said input means for detection of telephone signals and application to said input means of voltage signals corresponding with the detected telephone signals.

* * * * *